(12) United States Patent
Wang et al.

(10) Patent No.: US 12,490,587 B2
(45) Date of Patent: Dec. 2, 2025

(54) DISPLAY PANEL AND DISPLAY DEVICE (71) Applicant: HKC CORPORATION LIMITED, Shenzhen (CN)

(72) Inventors: Hailiang Wang, Shenzhen (CN); Baohong Kang, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 382 days.

(21) Appl. No.: 18/351,240

(22) Filed: Jul. 12, 2023

(65) Prior Publication Data

US 2024/0284704 A1  Aug. 22, 2024

(30) Foreign Application Priority Data

Feb. 20, 2023  (CN) .......................... 202310136050.1

(51) Int. Cl.
*H10K 50/86* (2023.01)
*H10K 59/122* (2023.01)
*H10K 59/126* (2023.01)
*H10K 59/35* (2023.01)

(52) U.S. Cl.
CPC ......... *H10K 50/865* (2023.02); *H10K 59/122* (2023.02); *H10K 59/126* (2023.02); *H10K 59/35* (2023.02)

(58) Field of Classification Search
CPC .... H10K 50/865; H10K 59/122; H10K 59/35; H10K 59/126
USPC .................................................. 313/498–512
See application file for complete search history.

(56) References Cited

U.S. PATENT DOCUMENTS

| | | | |
|---|---|---|---|
| 2013/0021390 A1 | 1/2013 | Inada | |
| 2017/0278443 A1 | 9/2017 | Zhang | |
| 2019/0317343 A1* | 10/2019 | Li | G09G 3/36 |
| 2021/0234134 A1 | 7/2021 | Qi et al. | |
| 2022/0199712 A1* | 6/2022 | Park | H10K 59/8792 |

(Continued)

FOREIGN PATENT DOCUMENTS

| | | |
|---|---|---|
| CN | 105679803 A | 6/2016 |
| CN | 108459429 A | 8/2018 |

(Continued)

OTHER PUBLICATIONS

WIPO, International Search Report for International Application No. PCT/CN2023/102766, Oct. 24, 2023.

(Continued)

*Primary Examiner* — Christopher M Raabe
(74) *Attorney, Agent, or Firm* — Hodgson Russ LLP (57) ABSTRACT

Disclosed are a display panel and a display device. The display panel includes a substrate and a light emitting layer and a light shielding layer formed on a side of the substrate in sequence. The light emitting layer includes first pixel components, each of the first pixel components includes a plurality of display sub-pixels with different colors and a plurality of anti-peeping sub-pixels with different colors; a corresponding one of the anti-peeping sub-pixels is arranged on at least one side of each of the display sub-pixels in each first pixel component. The light shielding layer includes light shielding components, and an orthographic projection of each of the anti-peeping sub-pixels on the light shielding layer is located in a corresponding one of the light shielding components.

20 Claims, 6 Drawing Sheets

(56) References Cited

U.S. PATENT DOCUMENTS

| | | | | |
|---|---|---|---|---|
| 2023/0209883 A1* | 6/2023 | Ji | ............................ | H10K 59/38 |
| | | | | 345/174 |
| 2024/0428729 A1* | 12/2024 | Yuan | ..................... | G09G 3/3233 |
| 2025/0040389 A1* | 1/2025 | Ma | ........................ | H10K 59/122 |

FOREIGN PATENT DOCUMENTS

| CN | 108549166 | 9/2018 |
|---|---|---|
| CN | 108549166 A | 9/2018 |
| CN | 111223904 | 6/2020 |
| CN | 111290115 A | 6/2020 |
| CN | 114326199 A | 4/2022 |
| CN | 115498124 | 12/2022 |
| CN | 115528193 | 12/2022 |
| CN | 115528193 A | 12/2022 |
| CN | 115843199 A | 3/2023 |

OTHER PUBLICATIONS

CNIPA, First Office Action for CN Application No. 202310136050.1, Mar. 27, 2023.

* cited by examiner

DISPLAY PANEL AND DISPLAY DEVICE

CROSS-REFERENCE TO RELATED APPLICATIONS

This application claims priority to Chinese Patent Application No. 202310136050.1, filed Feb. 20, 2023, the entire disclosure of which is incorporated herein by reference.

TECHNICAL FIELD

The present application relates to the technical field of displaying, and more specifically, to a display panel and a display device.

BACKGROUND

OLED (Organic Light-Emitting Diode) display panels do not require backlight, and have the advantages of bendability, small thickness, high brightness, low power consumption, fast response, wide color gamut and the like, thereby being widely used in electronic products such as televisions, mobile phones, and laptops.

The active light emitting characteristics of organic light-emitting diodes enable the OLED display panels to have a wider viewing angle, typically up to 170°. Due to the wider viewing angle of the display panels, users can be provided with a better visual experience. However, sometimes the users also hope that the viewing angle of the display panels can be reduced by adjustment, so as to effectively protect trade secrets and personal privacy.

Anti-peeping pixels are arranged in display panels to prevent peeping. Using the light emitted by the anti-peeping pixels to interfere with the light emitted by the display pixels can achieve anti-peeping during squinting, but the anti-peeping effect of the display panel containing anti-peeping pixels is poor.

SUMMARY

There are provided a display panel and a display device. The technical solution is as below:

According to a first aspect of the present disclosure, there is provided a display panel, including a substrate;
  a light emitting layer formed on a side of the substrate. The light emitting layer includes first pixel components, each of the first pixel components includes a plurality of display sub-pixels with different colors and a plurality of anti-peeping sub-pixels with different colors, and a corresponding one of the anti-peeping sub-pixels is arranged on at least one side of each of the display sub-pixels in each first pixel component; and
  a light shielding layer formed on a side of the light emitting layer away from the substrate. The light shielding layer includes light shielding components, and an orthographic projection of each of the anti-peeping sub-pixels on the light shielding layer is located in a corresponding one of the light shielding components.

According to a second aspect of the present disclosure, there is provided a display device, including the display panel above and a mainboard, and the mainboard is connected to the display panel.

It should be understood that the general description above and the detailed description below are only exemplary and explanatory, and cannot limit the present disclosure.

BRIEF DESCRIPTION OF THE DRAWINGS

The accompanying drawings herein are incorporated into the specification to constitute a part of this specification, show the embodiments consistent with the present application, and are used together with the specification to explain the principle of the present application. Apparently, the accompanying drawings in the description below merely illustrate some embodiments of the present application. Those of ordinary skill in the art may also derive other accompanying drawings from these accompanying drawings without creative efforts.

DETAILED DESCRIPTION OF THE EMBODIMENTS

The exemplary embodiments will now be described more fully with reference to the accompanying drawings. However, the exemplary embodiments can be implemented in various forms and should not be understood to be limited to the examples elaborated herein; and rather, these embodiments are provided so that the present application will be more comprehensive and complete, and the concept of the exemplary embodiments will be fully communicated to those skilled in the art.

In addition, the features, structures, or characteristics described may be combined in any suitable way in one or more embodiments. In the description below, many specific details are provided to give a full understanding of the embodiments of the present application. However, those skilled in the art will realize that the technical solution of the present application may be practiced without one or more specific details, or other methods, components, devices, steps, etc. may be employed. In other cases, the well-known methods, devices, implementations, or operations are not shown or described in detail to avoid blurring various aspects of the present application.

The present application is further described in detail below in conjunction with the accompanying drawings and the specific embodiments. Herein, it should be noted that the technical features involved in the embodiments of the present application described below may be combined with each other as long as they do not conflict with each other. The embodiments described below with reference to the accompanying drawings are exemplary, are intended to explain the present application, and should not be construed as a limitation to the present application.

Embodiment 1

Figure 1:
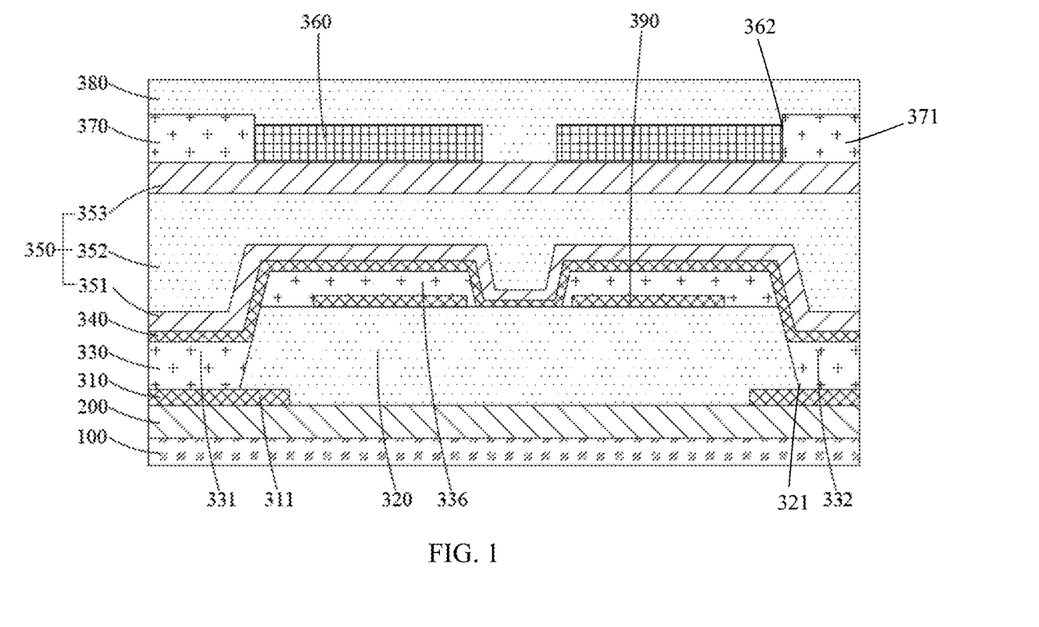
FIG. 1 is a structural schematic diagram of a display panel in Embodiment 1 of the present application.
Figure 2:
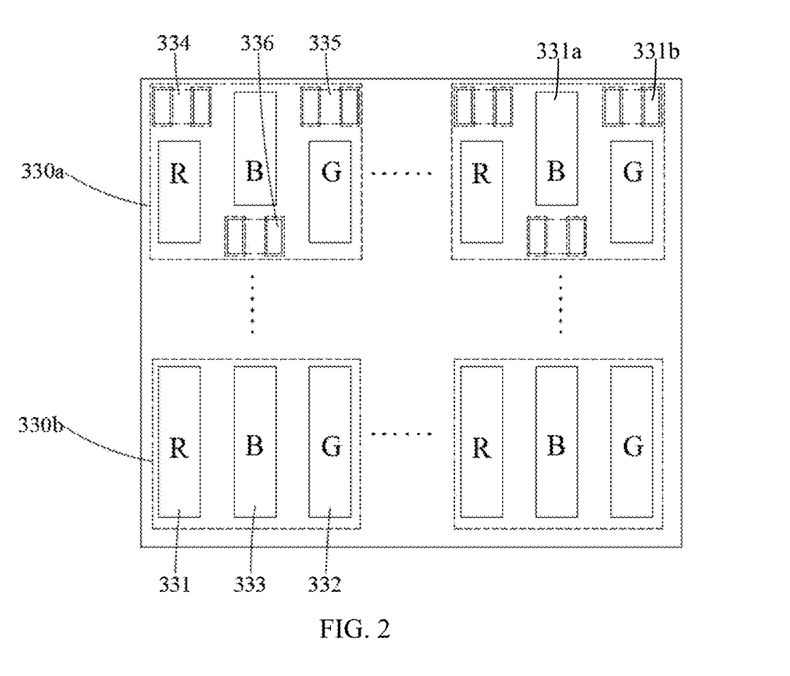
FIG. 2 is a schematic diagram of a first structure of a pixel unit in Embodiment 1 of the present application.
Figure 3:
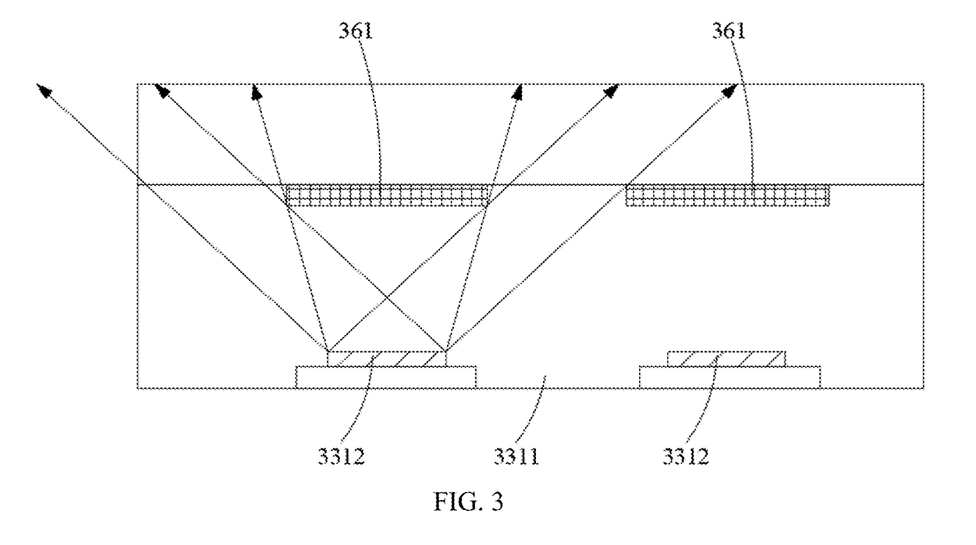
FIG. 3 is a schematic diagram of the anti-peeping principle of the display panel in Embodiment 1 of the present application.

As shown in FIG. 1 to FIG. 3, a display panel in this embodiment includes a substrate 100 and a driving circuit layer 200, a first anode layer 310, a pixel definition layer 320, a light emitting layer 330, a cathode layer 340, and a light shielding layer 360 formed on a side of the substrate 100.

The light emitting layer 330 includes first pixel components 330a. Each first pixel component 330a includes a plurality of display sub-pixels 331a with different colors and a plurality of anti-peeping sub-pixels 331b with different colors. For example, the plurality of display sub-pixels 331a with the different colors include a red display sub-pixel 331, a green display sub-pixel 332, and a blue display sub-pixel 333, and the plurality of anti-peeping sub-pixels 331b with the different colors include a red anti-peeping sub-pixel 334, a green anti-peeping sub-pixel 335, and a blue anti-peeping sub-pixel 336. The anti-peeping sub-pixels 331b are arranged on at least one side of each display sub-pixel 331a in each first pixel component 330a. The first anode layer 310 includes a plurality of first anodes 311 arranged at intervals, and the pixel definition layer 320 includes a plurality of via holes 321. At least part of each display sub-pixel 331a is located in the corresponding via hole 321 and is correspondingly connected to a first anode 311. The light shielding layer 360 includes light shielding components 361 in a one-to-one correspondence with the anti-peeping sub-pixels 331b, and an orthographic projection of each anti-peeping sub-pixel 331b on the light shielding layer 360 is located in the corresponding light shielding component 361.

It should be noted that the light emitting layer 330 may further includes second pixel components 330b. Each second pixel component 330b includes a plurality of display sub-pixels 331a with different colors, such as a red display sub-pixel 331, a green display sub-pixel 332, and a blue display sub-pixel 333. In other words, each first pixel component 330a includes the anti-peeping sub-pixels 331b, while each second pixel component 330b does not include the anti-peeping sub-pixels 331b.

The display panel has an anti-peeping mode. When the anti-peeping mode is disabled, the display sub-pixels 331a perform normal display, and the anti-peeping sub-pixels 331b are turned off, so that the display panel can perform clear display during direct viewing or squinting. When the anti-peeping mode is enabled, the anti-peeping sub-pixels 331b are turned on, light emitted forwards by the anti-peeping sub-pixels 331b are shielded by the light shielding components 361, and light emitted forwards by the display sub-pixels 331a is not disturbed, so that the display panel can perform clear display during direct viewing; and light emitted obliquely by the anti-peeping sub-pixels 331b is not shielded by the light shielding components 361, and light emitted obliquely by the display sub-pixels 331a will be mixed with the light emitted obliquely by the anti-peeping sub-pixels 331b, so that the display panel cannot perform clear display during squinting, thus achieving the anti-peeping effect.

In this embodiment, the display panel includes the light emitting layer 330 and the light shielding layer 360 formed on one side of the substrate 100 in sequence. The light emitting layer 330 includes the first pixel components 330a, and each first pixel component 330a includes a plurality of display sub-pixels 331a with the different colors and a plurality of anti-peeping sub-pixels 331b with the different colors; the display sub-pixels 331a with the different colors can be mutually superposed to obtain various colors of display light, and the anti-peeping sub-pixels 331b with the different colors can be mutually superposed to obtain various colors of anti-peeping light; when the anti-peeping mode is enabled, the various colors of anti-peeping light can be selected to interfere with the display light; and compared with the arrangement of a single anti-peeping sub-pixel 331b, the anti-peeping effect of the display panel can be improved.

For example, as shown in FIG. 1 to FIG. 3, the plurality of display sub-pixels 331a with the different colors include a red display sub-pixel 331, a green display sub-pixel 332, and a blue display sub-pixel 333 arranged in a row direction, the plurality of anti-peeping sub-pixels 331b with the different colors include a red anti-peeping sub-pixel 334, a green anti-peeping sub-pixel 335, and a blue anti-peeping sub-pixel 336 arranged in the row direction, the red anti-peeping sub-pixel 334 is arranged on at least one side of the red display sub-pixel 331 in a column direction, the green anti-peeping sub-pixel 335 is arranged on one side of the green display sub-pixel 332 in the column direction, and the blue anti-peeping sub-pixel 336 is arranged on one side of the blue display sub-pixel 333 in the column direction. Orthographic projections of the red display sub-pixel 331, the green display sub-pixel 332, and the blue display sub-pixel 333 on the substrate 100 have the same size and shape, while orthographic projections of the red anti-peeping sub-pixel 334, the green anti-peeping sub-pixel 335, and the blue anti-peeping sub-pixel 336 on the substrate 100 have the same size and shape.

When the red display sub-pixel 331, the green display sub-pixel 332, and the blue display sub-pixel 333 are arranged in the row direction, the red display sub-pixel 331, the green display sub-pixel 332, and the blue display sub-pixel 333 are set to have the same size and shape, and the red anti-peeping sub-pixel 334, the green anti-peeping sub-pixel 335, and the blue anti-peeping sub-pixel 336 are set to have the same size and shape, so that the sub-pixels with the different colors can be evaporated with a same set of fine metal mask (FMM), thereby reducing the manufacturing cost of the display panel.

Figure 4:
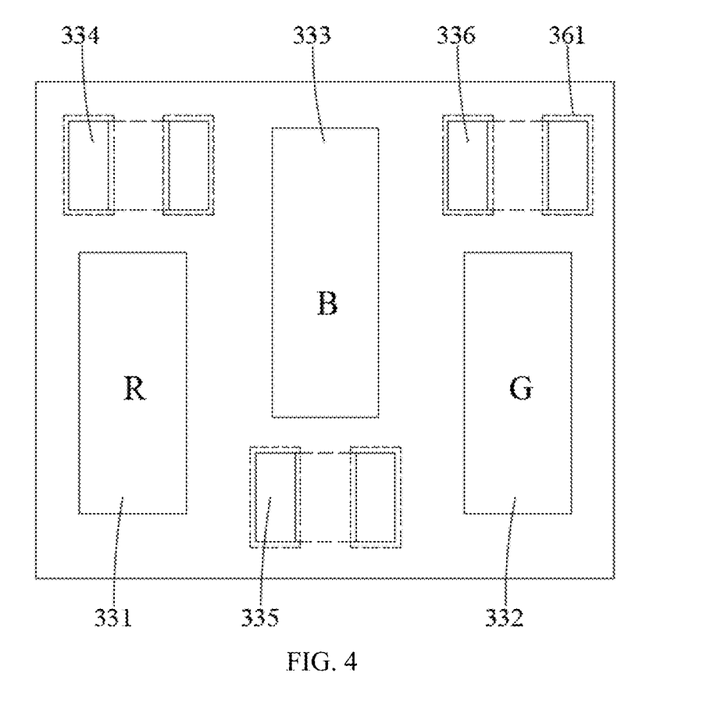
FIG. 4 is a schematic diagram of a second structure of the pixel unit in Embodiment 1 of the present application.

As shown in FIG. 4, in some embodiments, the red anti-peeping sub-pixel 334 is arranged on at least one side of the red display sub-pixel 331 in the column direction, the green anti-peeping sub-pixel 335 is arranged on one side of the blue display sub-pixel 333 in the column direction, and the blue anti-peeping sub-pixel 336 is arranged on one side of the green display sub-pixel 332 in the column direction. The orthographic projection of the blue anti-peeping sub-pixel 336 on the substrate 100 is larger than the orthographic projection of the green anti-peeping sub-pixel 335 on the substrate 100, and the orthographic projection of the blue display sub-pixel 333 on the substrate 100 is larger than the orthographic projection of the green display sub-pixel 332 on the substrate 100. In such design, the space occupied by the green anti-peeping sub-pixel 335 and the blue display sub-pixel 333 is the same as the space occupied by the blue anti-peeping sub-pixel 336 and the green display sub-pixel 332.

It should be understood that the red display sub-pixel 331 and the red anti-peeping sub-pixel 334 are formed from an organic light-emitting material that emits red light, the green display sub-pixel 332 and the green anti-peeping sub-pixel 335 are formed from an organic light-emitting material that emits green light, and the blue display sub-pixel 333 and the blue anti-peeping sub-pixel 336 are formed from an organic light-emitting material that emits blue light. The organic light-emitting material that emits the green light has higher brightness, and the organic light-emitting material that emits the blue light has lower brightness.

Based on the brightness characteristics of different organic light-emitting materials, the green anti-peeping sub-pixel 335 is arranged on one side of the blue display sub-pixel 333 in the column direction, the blue anti-peeping sub-pixel 336 is arranged on one side of the green display sub-pixel 332 in the column direction, the blue anti-peeping sub-pixel 336 is larger in size than the green anti-peeping sub-pixel 335, and the blue display sub-pixel 333 is larger in size than the green display sub-pixel 332, so that the brightness difference between the green display sub-pixel 332 and the blue display sub-pixel 333, and the brightness difference between the green anti-peeping sub-pixel 335 and the blue display sub-pixel 333 can be reduced. Meanwhile, the green anti-peeping sub-pixel 335 and the green display sub-pixel 332 are arranged in a staggered manner, and the blue anti-peeping sub-pixel 336 and the blue display sub-pixel 333 are arranged in a staggered manner, so that the light mixing effect is better, and the anti-peeping effect of the display panel can be improved.

As shown in FIG. 2, each first pixel component 330a includes three anti-peeping sub-pixels 331b, which are the red anti-peeping sub-pixel 334, the green anti-peeping sub-pixel 335, and the blue anti-peeping sub-pixel 336, respectively. One of the anti-peeping sub-pixels arranged in the middle of the row direction is located on one side of the corresponding display sub-pixel in the column direction, and another two of the anti-peeping sub-pixels are located on the other side of the corresponding display sub-pixel in the column direction. For example, the blue anti-peeping sub-pixel 336 is arranged in the middle in the row direction and located on a lower side of the corresponding display sub-pixel in the column direction, and the red anti-peeping sub-pixel 334 and the green anti-peeping sub-pixel 335 are located on an upper side of the corresponding display sub-pixel in the column direction.

It should be noted that an arrangement order of the red display sub-pixel 331, the green display sub-pixel 332, and the blue display sub-pixel 333 in the row direction can be set according to the situation, while an arrangement order of the red anti-peeping sub-pixel 334, the green anti-peeping sub-pixel 335, and the blue anti-peeping sub-pixel 336 can also be set according to the situation, which is not limited in the present application.

The blue anti-peeping sub-pixel 336 is arranged in the middle and located on the lower side of the corresponding display sub-pixel in the column direction, and the red anti-peeping sub-pixel 334 and the green anti-peeping sub-pixel 335 are located on the upper side of the corresponding display sub-pixel in the column direction. In such design, the red anti-peeping sub-pixel 334, the green anti-peeping sub-pixel 335, and the blue anti-peeping sub-pixel 336 can be designed to be larger in transverse size, thereby reducing the aperture ratio loss of the display panel.

Figure 5:
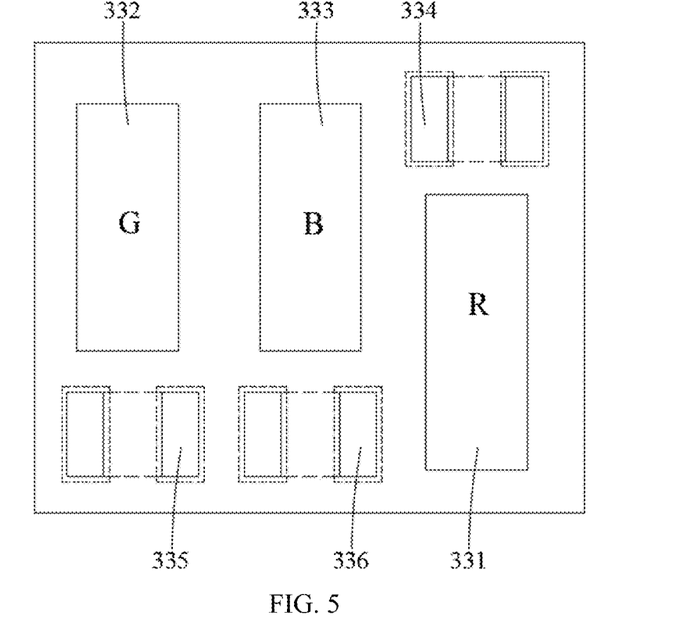
FIG. 5 is a schematic diagram of a third structure of the pixel unit in Embodiment 1 of the present application.

As shown in FIG. 5, in some embodiments, each first pixel component 330a includes three anti-peeping sub-pixels 331b, which are the red anti-peeping sub-pixel 334, the green anti-peeping sub-pixel 335, and the blue anti-peeping sub-pixel 336, respectively. One of the anti-peeping sub-pixels arranged aside in the row direction is located on one side of the corresponding display sub-pixel in the column direction, and another two of the anti-peeping sub-pixels are located on the other side of the corresponding display sub-pixel in the column direction. For example, the green anti-peeping sub-pixel 335 is arranged on a left side of the corresponding display sub-pixel in the row direction and on the upper side of the corresponding display sub-pixel in the column direction, the blue anti-peeping sub-pixel 336 is arranged in the middle of the corresponding display sub-pixel in the row direction and on the lower side of the corresponding display sub-pixel in the column direction, and the red anti-peeping sub-pixel 334 is arranged on a right side of the corresponding display sub-pixel in the row direction and on the lower side of the corresponding display sub-pixel in the column direction.

When two of the anti-peeping sub-pixels 331b are located on the same side of the corresponding display sub-pixel 331a in the column direction and are adjacent to each other, the light mixing effect of the two anti-peeping sub-pixels 331b is better.

It should be noted that the arrangement order of the red display sub-pixel 331, the green display sub-pixel 332, and the blue display sub-pixel 333 in the row direction can be set according to the situation, while the arrangement order of the red anti-peeping sub-pixel 334, the green anti-peeping sub-pixel 335, and the blue anti-peeping sub-pixel 336 can also be set according to the situation, so that any two anti-peeping sub-pixels can be set to be located on the same side of the corresponding display sub-pixel and to be adjacent to each other.

Figure 6:
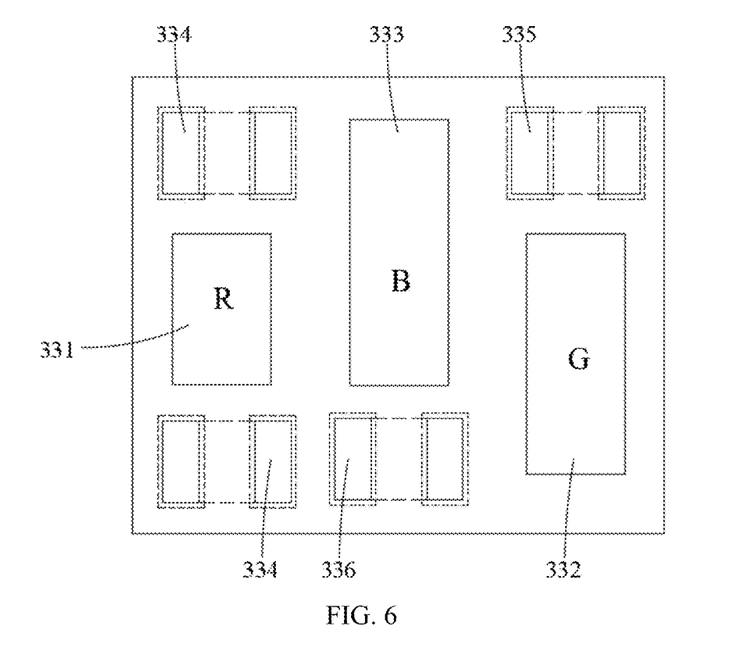
FIG. 6 is a schematic diagram of a fourth structure of the pixel unit in Embodiment 1 of the present application.

As shown in FIG. 6, in some embodiments, each first pixel component 330a includes two red anti-peeping sub-pixels 334, one green anti-peeping sub-pixel 335, and one blue anti-peeping sub-pixel 336. The two red anti-peeping sub-pixels 334 are arranged on two sides of the red display sub-pixel 331 in the column direction.

It should be understood that the red display sub-pixel 331 and the red anti-peeping sub-pixel 334 are formed from the organic light-emitting material that emits the red light, the organic light-emitting material that emits the red light has longer life, and each first pixel component 330a includes two red anti-peeping sub-pixels 334 arranged on two sides of the red display sub-pixel 331 in the column direction. In such design, the light mixing effect of the two adjacent anti-peeping sub-pixels on the same side is better. In addition, when the brightness difference between the sub-pixels with the different colors is set to be small, the life difference between the sub-pixels with the different colors is also small.

Figure 7:
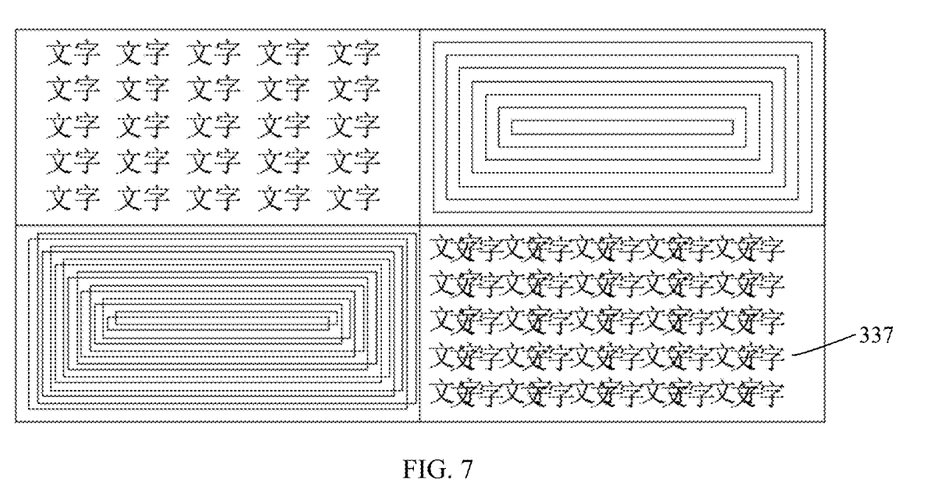
FIG. 7 is a schematic diagram of an anti-peeping pattern of the display panel in Embodiment 1 of the present application.

As shown in FIG. 2 and FIG. 7, the light emitting layer 330 may further includes second pixel components 330b. Each second pixel component 330b includes a plurality of display sub-pixels 331a with different colors, such as a red display sub-pixel 331, a green display sub-pixel 332, and a blue display sub-pixel 333. The light emitting layer 330 may include a plurality of anti-peeping areas 337. Each anti-peeping area 337 includes the first pixel components 330a and the second pixel components 330b, so that text structures or graph structures formed by different arrangements of the first pixel components 330a are different in different anti-peeping areas 337.

It should be noted that the light emitting layer 330 may includes a plurality of anti-peeping areas 337, but is not limited thereto, and the light emitting layer 330 may also be one anti-peeping area 337 as a whole, depending on the specific situation.

In some display panels, the light emitting layer 330 only includes the pixel units containing the anti-peeping sub-pixels. When the anti-peeping mode is enabled, all the anti-peeping sub-pixels are turned on simultaneously, which is equivalent to a layer of color change film. In this case, the anti peeping effect of the display panels is inferior to that of the display panels containing the second pixel component in its light emitting layer 330.

In this embodiment, the light emitting layer 330 may further includes second pixel components 330b. Each second pixel component 330b includes a plurality of display sub-pixels 331a with different colors. The light emitting layer 330 is divided into a plurality of anti-peeping areas 337, the arrangements of the first pixel components 330a in different anti-peeping areas 337 are different, and the anodes of at least the anti-peeping sub-pixels with the same color in the first pixel components 330a in each anti-peeping area 337 are connected, so that the first pixel components 330a form different text structures or graph structures. The anti-peeping effect of the display panel maybe improved compared with the solution which the light emitting layer 330 only includes the pixel units with the anti-peeping sub-pixels. In this application, when the anti-peeping mode is enabled, the anti-peeping sub-pixels will form a pattern structure or a text structure, and form a strong contrast with the display image. so that, on the one hand, the anti-peeping effect of the display panel is improved, and on the other hand, the power consumption of the display panel is reduced.

Referring to FIG. 1, the display panel further includes a second anode layer 390. The second anode layer 390 is located between the pixel definition layer 320 and the light emitting layer 330, that is, the first anode layer 310, the pixel definition layer 320, the second anode layer 390, the light emitting layer 330, the cathode layer 340, and the light shielding layer 360 are sequentially formed on the driving circuit layer 200, which is located on a side of the substrate 100.

The first anode layer 310 includes a plurality of first anodes 311 arranged at intervals, the pixel definition layer 320 includes a plurality of via holes 321, the second anode layer 390 includes a plurality of second anodes 391, at least a portion of the display sub-pixel is located in the via holes 321 and connected to the first anodes 311, and the anti-peeping sub-pixels 331b are located between the two adjacent via holes 321 and connected to the second anodes 391.

The arrangement of the anti-peeping sub-pixels between the two adjacent via holes can reduce or avoid the situation that the anti-peeping sub-pixels occupy design space of the display sub-pixels, thereby reducing or avoiding the aperture ratio loss of the display panel.

As shown in FIG. 1 and FIG. 7, in each anti-peeping area, the second anodes 391 corresponding to the red anti-peeping sub-pixel 334 are connected, the second anodes 391 corresponding to the green anti-peeping sub-pixel 335 are connected, and the second anodes 391 corresponding to the blue anti-peeping sub-pixel 336 are connected.

In the anti-peeping mode, a user can select at least one of the red anti-peeping sub-pixel 334, the green anti-peeping sub-pixel 335, and the blue anti-peeping sub-pixel 336 to be turned on, and can select the brightness of the red anti-peeping sub-pixel 334, the green anti-peeping sub-pixel 335, and the blue anti-peeping sub-pixel 336, to form a strong contrast between an anti-peeping pattern and a display pattern, thereby achieving the best anti-peeping effect.

Figure 8:
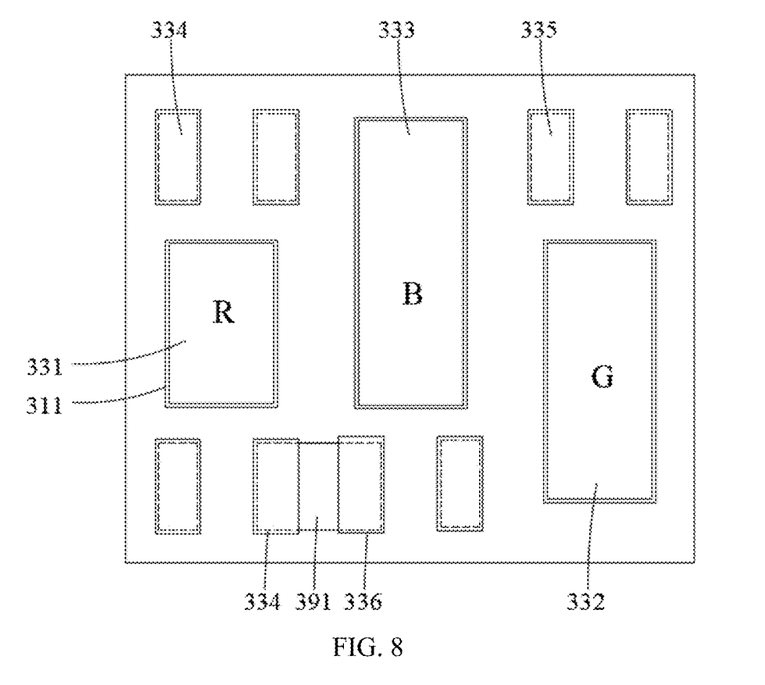
FIG. 8 is a schematic diagram of an anode pattern of the display panel in Embodiment 1 of the present application.

It should be noted that two or three of the second anode 391 corresponding to the red anti-peeping sub-pixel 334, the second anode 391 corresponding to the green anti-peeping sub-pixel 335, and the second anode 391 corresponding to the blue anti-peeping sub-pixel 336 may also be connected, as shown in FIG. 8. For example, the second anode 391 corresponding to the red anti-peeping sub-pixel 334 and the second anode 391 corresponding to the green anti-peeping sub-pixel 335 can be connected, and the user can select yellow or white light for prevention of peeping. When the user selects a yellow pattern for prevention of peeping, both the red anti-peeping sub-pixel 334 and the green anti-peeping sub-pixel 335 are turned on; and when the user selects a white pattern for prevention of peeping, the red anti-peeping sub-pixel 334, the green anti-peeping sub-pixel 335, and the blue anti-peeping sub-pixel 336 are turned on simultaneously.

As shown in FIG. 1 to FIG. 4, each anti-peeping sub-pixel 331b may includes a hollow area 3311 and at least a edge areas 3312 located on at least one side of the hollow area 3311. The shape of the hollow area 3311 can be set according to the situation. For example, the middle of the anti-peeping sub-pixel 331b is partially hollowed out to form a concentric-square-shaped structure, or the middle of the anti-peeping sub-pixel 331b is completely hollowed out, and the edge areas 3312 are located on two sides of the hollow area 3311 in the row or column direction.

As shown in FIG. 3, for the display panel, a structure such as cover plate glass or a polarizer is further generally arranged on a side of the light shielding layer 360 away from the substrate 100, the light passing around the light shielding components 361 of the anti-peeping sub-pixels 331b is anti-peeping light, and the anti-peeping light emitted from the edge areas 3312 of each anti-peeping sub-pixel 331b can pass through the structure such as the cover plate glass or the polarizer; and due to a larger light emitting angle than the edge areas 3312, the anti-peeping light emitted from a central area of each anti-peeping sub-pixel will be totally reflected on the cover plate glass or the polarizer, which not only fails to achieve the anti-peeping effect, but may also interfere with light emitted by the corresponding display sub-pixel.

In this embodiment, each anti-peeping sub-pixel 331b includes the hollow area 3311 and the edge areas 3312 located on at least one side of the hollow area 3311; the anti-peeping light emitted from the edge areas 3312 of each anti-peeping sub-pixel 331b can pass through the structure such as the cover plate glass or the polarizer, thereby achieving the anti-peeping effect; and an organic light-emitting material is not evaporated on the hollow area 3311 of each anti-peeping sub-pixel, thereby reducing the consumption of the organic luminescent material and the manufacturing cost of the display panel.

It should be noted that the light shielding components 361 are configured to shield small-angle anti-peeping light from the anti-peeping sub-pixels, so that the light shielding components 361 can be hollowed out according to the shape of the anti-peeping sub-pixels, depending on the specific situation.

As shown in FIG. 1, the display panel further includes an encapsulating layer 350 formed on a side of the cathode layer 340 away from the substrate 100. The light shielding layer 360 is formed on a side of the encapsulating layer 350 away from the substrate 100. The encapsulating layer 350 includes a first inorganic encapsulating layer 351, an organic encapsulating layer 352, and a second inorganic encapsulating layer 353. The first inorganic encapsulating layer 351 is formed on a side of the cathode layer 340 away from the substrate 100, the organic encapsulating layer 352 is formed on a side of the first inorganic encapsulating layer 351 away from the substrate 100, and the second inorganic encapsulating layer 353 is formed on a side of the organic encapsulating layer 352 away from the substrate 100.

The encapsulating layer 350 is formed between the cathode layer 340 and the light shielding layer 360, which can prevent the failure of the light emitting layer 330 formed by the organic light-emitting material from being invaded by water and oxygen. The light shielding layer 360 is formed a one side of the encapsulating layer 350 away from the substrate 100, which can increase the distance between the light shielding layer 360 and the light emitting layer 330, thereby facilitating the adjustment of the light emitting angle of the anti-peeping sub-pixels.

As shown in FIG. 1, the display panel further includes a color resistor layer 370 and an anti-reflective layer 380. The color resistor layer 370 is formed on a side of the encapsulating layer 350 away from the substrate 100, the color resistor layer 370 includes a plurality of color resistors 371, and orthographic projections of the display sub-pixels 331a on the color resistor layer 370 are located in the color resistors 371 in a one-to-one correspondence manner. The plurality of color resistors 371 are a red resistor, a green resistor, and a blue resistor, respectively. The red resistor, the green resistor, and the blue color resistor are in a one-to-one correspondence with the red display sub-pixel 331, the green display sub-pixel 332, and the blue display sub-pixel 333. The light shielding layer 360 further includes black matrixes 362 arranged on the same layer as the light shielding components 361. The black matrixes 362 are arranged around the red resistor, the green resistor, and the blue resistor. Light emitting gaps are provided between the peripheries of the light shielding components 361 and the black matrixes 362 and between the peripheries of the light shielding components and the color resistors, to facilitate the anti-peeping sub-pixels to emit the light from the peripheries of the light shielding components 361. The anti-reflective layer 380 is formed on a side of the color resistor layer 370 away from the substrate 100.

To improve the contrast of a display device and achieve the integrated black effect, the polarizer is usually used for the OLED display panel, because the polarizer can effectively reduce the reflection intensity of external ambient light on a screen. However, the light transmittance of the polarizer is generally only about 44%, so that higher power needs to be provided for achieving higher light emitting brightness. In addition, the polarizer is thicker and brittle, which is unfavourable for the development of a dynamic bending product.

In this embodiment, the display panel includes the anti-reflective layer 380, which can reduce the reflection intensity of the external ambient light on the screen. In addition, the anti-reflective layer 380 further has a certain blocking effect, which can protect the OLED display panel. The anti-reflective layer 380 is used to reduce the reflection intensity of the external ambient light on the screen, the color resistor layer 370 is used to block the external light and filter light emitted by display light emitting units, and the polarizer of the OLED display panel can be removed, so that the thickness of a function layer will be greatly reduced, and the light emitting rate can be increased from 44% to 80%, thereby greatly increasing the light emitting brightness, and reducing the power consumption of the OLED display panel.

Embodiment 2

Figure 10:
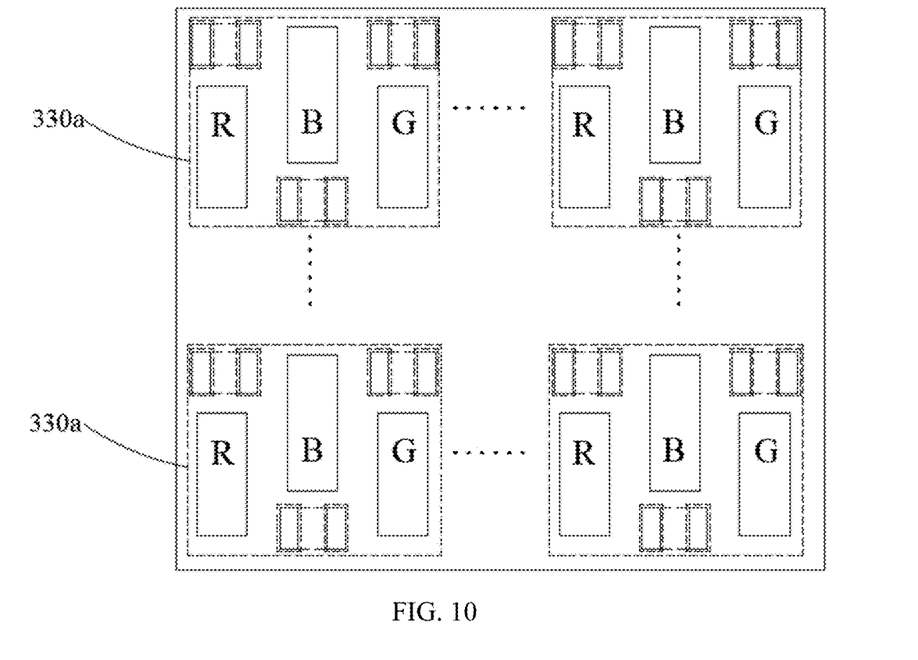
FIG. 10 is a structural schematic diagram of a pixel unit in Embodiment 2 of the present application.

The main difference between Embodiment 2 and Embodiment 1 is that the light emitting layer 330 in Embodiment 1 includes the first pixel components 330a and the second pixel components 330b, while the light emitting layer 330 in Embodiment 2 includes the first pixel components 330a. In other words, in Embodiment 2, the light emitting layer 330 only includes the first pixel components 330a and does not includes the second pixel components 330b, as shown in FIG. 10. Each first pixel component 330a includes a plurality of display sub-pixels 331a with different colors and a plurality of anti-peeping sub-pixels 331b with different colors. The plurality of display sub-pixels 331a with the different colors include the red display sub-pixel 331, the green display sub-pixel 332, and the blue display sub-pixel 333, and the plurality of anti-peeping sub-pixels 331b with the different colors include the red anti-peeping sub-pixel 334, the green anti-peeping sub-pixel 335, and the blue anti-peeping sub-pixel 336.

The display panel further includes the second anodes 391. Each second anode 391 is connected to one anti-peeping sub-pixel in a one-to-one correspondence manner, in other words, each anti-peeping sub-pixel can be individually turned on or turned off.

The light emitting layer 330 includes the first pixel components 330a. Each first pixel component 330a includes the red anti-peeping sub-pixel 334, the green anti-peeping sub-pixel 335, and the blue anti-peeping sub-pixel 336, and each anti-peeping sub-pixel 331b can be individually turned on or turned off. In such design, the display panel can form variable anti-peeping patterns, thereby achieving the better anti-peeping effect.

In addition, since each anti-peeping sub-pixel 331b can be individually turned on or turned off, the anti-peeping sub-pixel 331b can be controlled according to the color of the display sub-pixel. For example, if a first pixel component 330a displays red, the green anti-peeping sub-pixel 335 and the blue anti-peeping sub-pixel 336 can be turned on to adjust the first pixel component 330a to display white light. When at least some or all of the first pixel components 330a display white, the display image is completely disturbed, thereby achieving the best anti-peeping effect.

Figure 9:
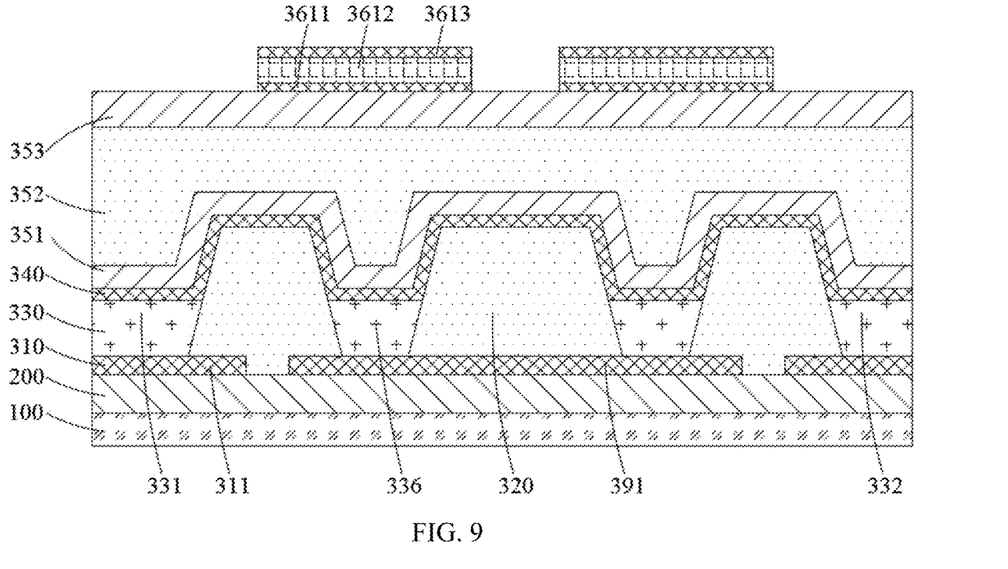
FIG. 9 is a structural schematic diagram of a display panel in Embodiment 2 of the present application.

As shown in FIG. 9, the second anodes 391 and the first anodes 311 are arranged on the same layer, that is, the second anodes 391 and the first anodes 311 are arranged between the driving circuit layer 200 and the pixel definition layer 320.

Since the second anodes 391 and the first anodes 311 are arranged on the same layer, the manufacturing process of the display panel can be simplified and the manufacturing cost of the display panel can be reduced.

As shown in FIG. 9, each light shielding component 361 includes a first electrode 3611, a color change structure layer 3612, and a second electrode 3613 formed in sequence.

The display panel has the anti-peeping mode. When the anti-peeping mode is enabled, a voltage is applied between the first electrode 3611 and the second electrode 3613, and the color change structure layer 3612 becomes opaque and can shield the light. When the anti-peeping mode is disabled, the color change structure layer 3612 becomes transparent and can transmit the light.

When the anti-peeping mode is enabled, the light shielding component 361 can shield the light, and when the anti-peeping mode is disabled, the light shielding component 361 can transmit the light. In such design, when the anti-peeping mode is disabled, the red anti-peeping sub-pixel 334, the green anti-peeping sub-pixel 335, and the blue anti-peeping sub-pixel 336 can be used as the display sub-pixels to participate in display. When the red anti-peeping sub-pixel 334, the green anti-peeping sub-pixel 335, and the blue anti-peeping sub-pixel 336 participate in display, the display panel with the anti-peeping sub-pixels has almost no loss in aperture ratio compared with the conventional display panel with conventional red, green, and blue display sub-pixels.

Embodiment 3

Figure 11:
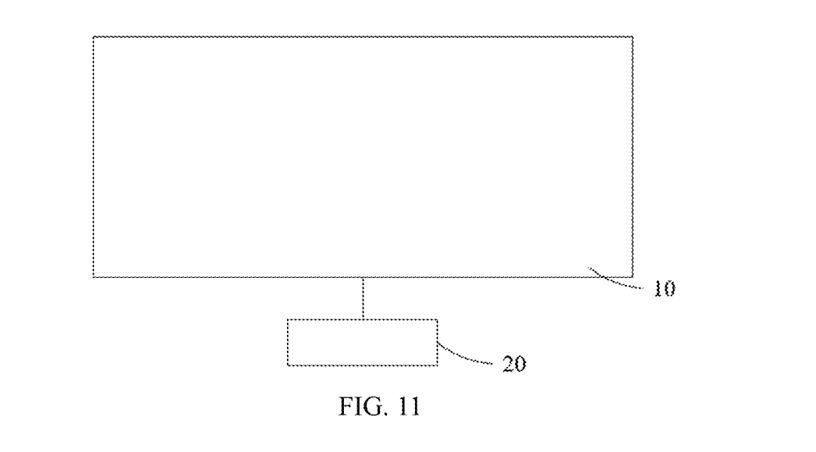
FIG. 11 is a schematic structural diagram of a display device in Embodiment 3 of the present application.

As shown in FIG. 11, the present application further provides a display device, including a display panel 10 and a mainboard 20. The mainboard 20 is connected to the display panel 10 and configured to drive the display panel 10 to display images. The display panel 10 includes the display panel 10 disclosed in Embodiment 1 and Embodiment 2.

In this embodiment, the display device includes the display panel 10. The display panel includes a light emitting layer 330 and a light shielding layer 360 formed on one side of a substrate 100 in sequence, the light emitting layer 330 includes first pixel components 330a, and each first pixel component 330a includes a plurality of display sub-pixels with different colors and a plurality of anti-peeping sub-pixels with different colors; the display sub-pixels with the different colors can be mutually superposed to obtain various colors of display light, and the anti-peeping sub-pixels with the different colors can be mutually superposed to obtain various colors of anti-peeping light; when an anti-peeping mode is enabled, the various colors of anti-peeping light can be selected to interfere with the display light; and compared with the arrangement of a single anti-peeping sub-pixel, the anti-peeping effect of the display panel 10 can be improved.

The terms such as "first" and "second" are only used for descriptive purposes, and cannot be construed as indicating or implying relative importance or implying the number of technical features indicated. Thus, the feature defined by "first", "second", etc. may explicitly or implicitly include one or more features. In the description of the present application, "a plurality of" means two or more, unless otherwise expressly and specifically defined.

In the present invention, the terms such as "assembly" and "connection" should be understood in a broad sense, unless otherwise expressly specified and defined. For example, "connection" may be fixed connection, detachable connection, or integrated connection; "connection" may be mechanical connection or electrical connection; and "connection" may be direct connection, indirect connection via an intermediate medium, internal connection between two elements, or interaction between two elements. Those of ordinary skill in the art may understand specific meanings of the above terms in the present application according to specific circumstances.

In the description of this specification, the description with reference to the terms such as "some embodiments" and "examples" means that the specific features, structures, materials or characteristics described in combination with the embodiments or examples are included in at least one embodiment or example of the present application. In this specification, the schematic representations of the above terms do not necessarily refer to the same embodiments or examples. Moreover, the specific features, structures, materials or characteristics described may be combined in a suitable way in any one or more embodiments or examples. In addition, those skilled in the art may combine different embodiments or examples described in this specification and features of different embodiments or examples, without mutual contradiction.

Although the embodiments of the present application have been shown and described above, it may be understood that the above embodiments are exemplary and cannot be understood as a limitation to the present application. Those of ordinary skill in the art may make changes, modifications, substitutions, and variations to the above embodiments within the scope of the present application. Therefore, any changes or modifications made in accordance with the claims and specification of the present application should fall within the scope of the patent application.

What is claimed is:

1. A display panel, comprising:
 a substrate;
 a light emitting layer formed on a side of the substrate, wherein the light emitting layer comprises first pixel components, each of the first pixel components comprises a plurality of display sub-pixels with different colors and a plurality of anti-peeping sub-pixels with different colors, and a corresponding one of the plurality of anti-peeping sub-pixels is arranged on at least one side of each of the plurality of display sub-pixels in each first pixel components; and
 a light shielding layer formed on a side of the light emitting layer away from the substrate, wherein the light shielding layer comprises light shielding components, and an orthographic projection of each of the plurality of anti-peeping sub-pixels on the light shielding layer is located in a corresponding one of the light shielding components.

2. The display panel according to claim 1, wherein the plurality of display sub-pixels with the different colors comprise a red display sub-pixel, a green display sub-pixel, and a blue display sub-pixel arranged in a row direction, wherein the plurality of anti-peeping sub-pixels with the different colors comprise a red anti-peeping sub-pixel, a green anti-peeping sub-pixel, and a blue anti-peeping sub-pixel arranged in the row direction, wherein the red anti-peeping sub-pixel is arranged on at least one side of the red display sub-pixel in a column direction, wherein the green anti-peeping sub-pixel is arranged on one side of the green display sub-pixel in the column direction, and wherein the blue anti-peeping sub-pixel is arranged on one side of the blue display sub-pixel in the column direction; or
 wherein the red anti-peeping sub-pixel is arranged on at least one side of the red display sub-pixel in the column direction, wherein the green anti-peeping sub-pixel is arranged on one side of the blue display sub-pixel in the column direction, wherein the blue anti-peeping sub-pixel is arranged on one side of the green display sub-pixel in the column direction, wherein an orthographic projection of the blue anti-peeping sub-pixel on the substrate is larger than an orthographic projection of the green anti-peeping sub-pixel on the substrate, and wherein an orthographic projection of the blue display sub-pixel on the substrate is larger than an orthographic projection of the green display sub-pixel on the substrate.

3. The display panel according to claim 2, wherein each of the first pixel components comprises three anti-peeping sub-pixels, wherein one of the three anti-peeping sub-pixels arranged in a middle of the row direction is located on one side of a corresponding one of the plurality of display sub-pixels in the column direction, and another two of the three anti-peeping sub-pixels are located on an other side of the corresponding one of the plurality of display sub-pixels in the column direction.

4. The display panel according to claim 2, wherein each of the first pixel components comprises three anti-peeping sub-pixels, wherein one of the three anti-peeping sub-pixels arranged aside in the row direction is located on one side of a corresponding one of the plurality of display sub-pixels in the column direction, and another two of the three anti-peeping sub-pixels are located on an other side of the corresponding one of the plurality of display sub-pixels in the column direction.

5. The display panel according to claim 2, wherein each of the first pixel components comprises two red anti-peeping sub-pixels, one green anti-peeping sub-pixel, and one blue anti-peeping sub-pixel, and wherein the two red anti-peeping sub-pixels are arranged on two sides of the red display sub-pixel in the column direction.

6. The display panel according to claim 2, further comprising a first anode layer, a pixel definition layer, a second anode layer and a cathode layer, wherein the first anode layer, the pixel definition layer, the second anode layer, the light emitting layer, the cathode layer, and the light shielding layer are sequentially formed on the substrate, wherein the first anode layer comprises a plurality of first anodes arranged at intervals, wherein the pixel definition layer comprises a plurality of via holes, wherein the second anode layer comprises a plurality of second anodes, wherein at least a portion of the plurality of display sub-pixels is located in the plurality of via holes and connected to first anodes, and the plurality of anti-peeping sub-pixels are located between adjacent two of the plurality of via holes and connected to second anodes.

7. The display panel according to claim 6, wherein the light emitting layer further comprises second pixel components, and each of the second pixel components comprises the red display sub-pixel, the green display sub-pixel, and the blue display sub-pixel; and
wherein the light emitting layer comprises a plurality of anti-peeping areas, and text structures or graph structures formed by an arrangement of the first pixel components are different in different anti-peeping areas.

8. The display panel according to claim 7, wherein in each of the plurality of anti-peeping areas, the second anodes corresponding to the red anti-peeping sub-pixel are connected, the second anodes corresponding to the green anti-peeping sub-pixel are connected, and the second anodes corresponding to the blue anti-peeping sub-pixel are connected.

9. The display panel according to claim 1, further comprising a color resistor layer formed on a side of the light emitting layer away from the substrate, wherein the color resistor layer comprises a plurality of color resistors, orthographic projections of the plurality of display sub-pixels on the color resistor layer are located in the plurality of color resistors in a one-to-one correspondence manner, wherein the light shielding layer further comprises black matrixes arranged around the plurality of color resistors, and the black matrixes and the light shielding components are arranged on a same layer.

10. The display panel according to claim 1, wherein each of the light shielding components comprises a first electrode, a color change structure layer, and a second electrode formed in sequence.

11. A display device, comprising a display panel and a mainboard, wherein the mainboard is connected to the display panel, wherein the display device comprises:
a substrate;
a light emitting layer formed on a side of the substrate, wherein the light emitting layer comprises first pixel components, each of the first pixel components comprises a plurality of display sub-pixels with different colors and a plurality of anti-peeping sub-pixels with different colors, and a corresponding one of the plurality of anti-peeping sub-pixels is arranged on at least one side of each of the plurality of display sub-pixels in each first pixel components; and
a light shielding layer formed on a side of the light emitting layer away from the substrate, wherein the light shielding layer comprises light shielding components, and an orthographic projection of each of the plurality of anti-peeping sub-pixels on the light shielding layer is located in a corresponding one of the light shielding components.

12. The display device according to claim 11, wherein the plurality of display sub-pixels with the different colors comprise a red display sub-pixel, a green display sub-pixel, and a blue display sub-pixel arranged in a row direction, wherein the plurality of anti-peeping sub-pixels with the different colors comprise a red anti-peeping sub-pixel, a green anti-peeping sub-pixel, and a blue anti-peeping sub-pixel arranged in the row direction, wherein the red anti-peeping sub-pixel is arranged on at least one side of the red display sub-pixel in a column direction, wherein the green anti-peeping sub-pixel is arranged on one side of the green display sub-pixel in the column direction, and wherein the blue anti-peeping sub-pixel is arranged on one side of the blue display sub-pixel in the column direction; or
wherein the red anti-peeping sub-pixel is arranged on at least one side of the red display sub-pixel in the column direction, wherein the green anti-peeping sub-pixel is arranged on one side of the blue display sub-pixel in the column direction, wherein the blue anti-peeping sub-pixel is arranged on one side of the green display sub-pixel in the column direction, wherein an orthographic projection of the blue anti-peeping sub-pixel on the substrate is larger than an orthographic projection of the green anti-peeping sub-pixel on the substrate, and wherein an orthographic projection of the blue display sub-pixel on the substrate is larger than an orthographic projection of the green display sub-pixel on the substrate.

13. The display device according to claim 12, wherein each of the first pixel components comprises three anti-peeping sub-pixels, wherein one of the plurality of anti-peeping sub-pixels arranged in a middle of the row direction is located on one side of a corresponding one of the plurality of display sub-pixels in the column direction, and another two of the plurality of anti-peeping sub-pixels are located on an other side of the corresponding one of the plurality of display sub-pixels in the column direction.

14. The display device according to claim 12, wherein each of the first pixel components comprises three anti-peeping sub-pixels, wherein one of the three anti-peeping sub-pixels arranged aside in the row direction is located on one side of a corresponding one of the plurality of display sub-pixels in the column direction, and another two of the three anti-peeping sub-pixels are located on an other side of the corresponding one of the plurality of display sub-pixels in the column direction.

15. The display device according to claim 12, wherein each of the first pixel components comprises two red anti-peeping sub-pixels, one green anti-peeping sub-pixel, and one blue anti-peeping sub-pixel, and wherein the two red anti-peeping sub-pixels are arranged on two sides of the red display sub-pixel in the column direction.

16. The display device according to claim 12, wherein the display panel further comprises a first anode layer, a pixel definition layer, a second anode layer and a cathode layer, wherein the first anode layer, the pixel definition layer, the second anode layer, the light emitting layer, the cathode layer and the light shielding layer are sequentially formed on the substrate, wherein the first anode layer comprises a plurality of first anodes arranged at intervals, wherein the pixel definition layer comprises a plurality of via holes, wherein the second anode layer comprises a plurality of second anodes, wherein at least a portion of the plurality of display sub-pixels is located in the plurality of via holes and connected to first anodes, and the plurality of anti-peeping sub-pixels are located between adjacent two of the plurality of via holes and connected to second anodes.

17. The display device according to claim 16, wherein the light emitting layer further comprises second pixel components, and each of the second pixel components comprises the red display sub-pixel, the green display sub-pixel, and the blue display sub-pixel; and wherein the light emitting layer comprises a plurality of anti-peeping areas, and text structures or graph structures formed by an arrangement of the first pixel components are different in different anti-peeping areas.

18. The display device according to claim 17, wherein in each of the plurality of anti-peeping areas, the second anodes corresponding to the red anti-peeping sub-pixel are connected, the second anodes corresponding to the green anti-peeping sub-pixel are connected, and the second anodes corresponding to the blue anti-peeping sub-pixel are connected.

19. The display device according to claim 11, wherein the display panel further comprises a color resistor layer formed on a side of the light emitting layer away from the substrate, wherein the color resistor layer comprises a plurality of color resistors, orthographic projections of the plurality of display sub-pixels on the color resistor layer are located in the plurality of color resistors in a one-to-one correspondence manner, wherein the light shielding layer further comprises black matrixes arranged around the plurality of color resistors, and the black matrixes and the light shielding components are arranged on a same layer.

20. The display device according to claim 11, wherein each of the light shielding components comprises a first electrode, a color change structure layer and a second electrode formed in sequence.

\* \* \* \* \*